United States Patent

Nakamura

[11] 4,270,604
[45] Jun. 2, 1981

[54] HEAT SINK

[75] Inventor: Masakazu Nakamura, Amagasaki, Japan

[73] Assignee: Sumitomo Precision Products Co. Ltd., Amagasaki, Japan

[21] Appl. No.: 94,096

[22] Filed: Nov. 14, 1979

[30] Foreign Application Priority Data

Nov. 17, 1978 [JP] Japan .................. 53/159302[U]

[51] Int. Cl.³ .............................. H01L 23/36
[52] U.S. Cl. ................... 165/185; 174/16 HS; 357/81; 361/386
[58] Field of Search ............... 361/383, 384, 386; 174/16 R, 16 HS; 357/81, 82; 165/185, 80 B, 80 C

[56] References Cited

U.S. PATENT DOCUMENTS

| | | | |
|---|---|---|---|
| 2,416,152 | 2/1947 | Braun | 357/82 |
| 3,327,776 | 6/1967 | Butt | 174/16 HS |
| 3,833,837 | 9/1974 | West | 361/384 |
| 4,022,272 | 5/1977 | Miller | 165/185 |
| 4,027,206 | 5/1977 | Lee | 361/384 |

FOREIGN PATENT DOCUMENTS

| | | | |
|---|---|---|---|
| 2460631 | 7/1976 | Fed. Rep. of Germany | 357/81 |
| 1323991 | 12/1963 | France | 357/81 |
| 1355802 | 12/1964 | France | 357/81 |

*Primary Examiner*—Sheldon J. Richter
*Attorney, Agent, or Firm*—Watson, Cole, Grindle & Watson

[57] ABSTRACT

The invention involves to improvements in heat snk. Required numbers of corrugated fins and separator sheets are alternately stacked together with side bars applied to the opposite edges of each corrugated fin, and all the parts are brazed together.

Large thickness side bars are used for either one side or both sides, and the edges of the separator sheets and outer sides of the side bars are aligned, and a heat source is mounted on the outer surfaces of side bars. In this way, a heat sink of a desired sides can be assemble, and also the heat radiator performance can be improved.

5 Claims, 4 Drawing Figures

HEAT SINK

BACKGROUND OF THE INVENTION

1. Field of the Invention

This invention relates to improvements in and relating to the heat sink for electronic apparatus, which is provided with such heat source as transistors and thyristors and in which heat is dissipated into atmosphere by thermal conduction.

2. Description of the Prior Art

Up to date, the capacity of transistors, thyristors and other electronic apparatus parts are on an increasing trend with accompanied increase of thermal loss, while the size of the electronic apparatus themselves is reducing. This means a tendency of increase of the temperature inside the apparatus. In this respect, for maintaining the performance of the apparatus and extending the life thereof it is necessary to dissipate the internal heat into the outside and keep low inside temperature. Usually, the end is achieved with a heat sink, on which electronic apparatus parts are mounted so that heat is radiated through it.

Hitherto, there are two kinds of heat sink of this type. FIG. 1 shows a heat sink 8 of one of these kinds. The heat sink 8, which is extrusion molded mostly from a light metal such as aluminum, has a comb-shaped sectional profile and is cut to a desired length, and a heat source 6 such as a power transistor is mounted by suitable means 10 such as screws on the bottom of the heat sink 8. This kind of heat sink may also use other metals than light metals, and also it may be formed by casting or machine processing as well as extrusion molding.

With this heat sink the heat radiation area is small, while the other kind of heat sink, which is shown in FIG. 2, has large capacity. This heat sink 9 is formed by alternately stacking corrugated fins 2 and separator sheets 3, applying side bars 4 to one side of the stack and a bottom plate 7 to the other side and brazing together all the parts, and heat source 6 such as a power transistor is mounted by suitable means 10 such as screws on the bottom plate 7.

With this type of heat sink shown in FIG. 2, however, although the brazing of the corrugated fins 2 to the separator sheets 3, bottom plate 7 and side bars 4 and brazing of the separator sheets 3 and side bars 4 are substantially perfectly made, the brazing of the bottom plate 7 and separator sheets 4 is difficult because the contact area involved is small, giving rise to high thermal resistance in these portions and tending to reduce the heat radiation performance. The contact area between each corrugated fin 2 and each separator 3 is also small, but the brazing in these portions has no bearing upon the mechanical strength of the heat sink as a whole, and also they are soldered together at many points, so there is no problem.

In another aspect, since the size of the heat sink is determined by the size of the bottom plate, different bottom plates of various sizes have to be prepared in case when heat sinks of various sizes are to be produced, and this has been a drawback from the standpoint of improving the productivity.

SUMMARY OF THE INVENTION

The invention has an object of improving and overcoming the afore-mentioned drawbacks by the provision of a heat sink, which comprises corrugated fins, and with which a heat source is directly mounted on its side bars.

The features of the improvement according to the invention, over the heat sink formed by alternately stacking and brazing together corrugated fins and separator sheets, reside in applying side bars to the opposite edges of the corrugated fins, making smooth and flat surfaces with the edges of the separator sheets and side bars, using large thickness side bars at least on one side of the heat sink and mounting a heat source on the outer surface of large thickness side bars.

Further objects, advantages and features of the present invention will become more fully apparent from a detailed consideration of the arrangement and construction of the constituent parts as set forth in the following specification taken together with the accompanying drawings.

DETAILED DESCRIPTION OF THE PREFERRED EMBODIMENTS

Figure 1:
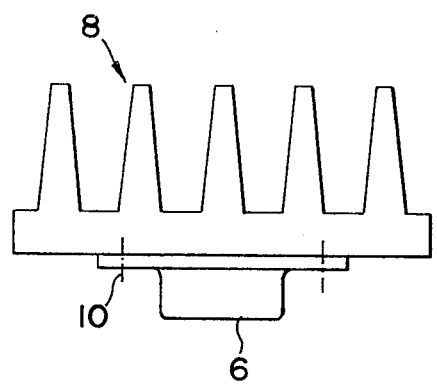
FIG. 1 is an elevational view showing a prior-art heat sink having an integral structure.
Figure 2:
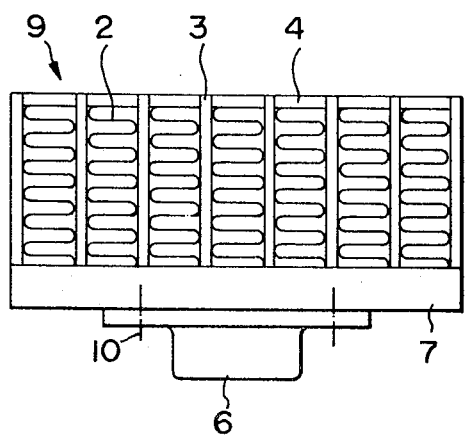
FIG. 2 is an elevational view showing another prior-art heat sink having a bottom plate.
Figure 3:
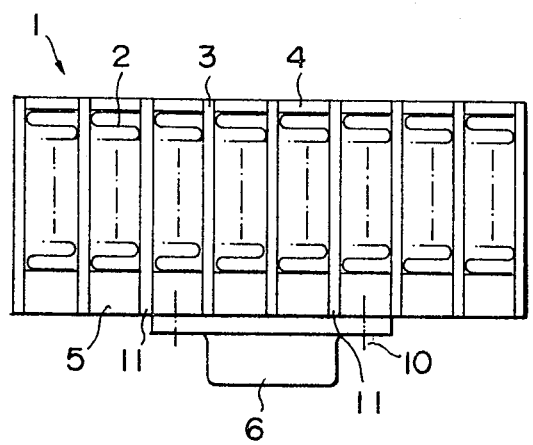
FIG. 3 is an elevational view showing one embodiment of the invention.

An embodiment of the invention will now be described with reference to the accompanying drawings. Corrugated fins 2 and separator sheets 3 are alternately stacked together, side bars 4 having an ordinary thickness are each applied to one edge of each corrugated fin 2, and side bars 5 having a large thickness are each applied to the other edge of each corrugated fin. The individual parts are all brazed together to form a heat sink 1. A heat source 6 such as a power transistor is directly mounted by screws or other suitable means 10 on the outer surface of some large thickness side bars 5 so that it engages the edges 11 of some separator sheets 3.

In case of using aluminum for the heat sink 1, brazing sheets are used for the separator sheets for brazing the corrugated fins 2 and side bars 4 and 5 alternately stacked with them. In case of using copper as the material, soldering or silver brazing is adopted, and in case of stainless steel silver brazing, copper brazing or nickel brazing is adopted. In case of using other metals than mentioned as the material, suitable brazes may be selected.

If the surface of the heat sink for mounting the heat source, that is, the surface constituted by the edges 11 of the side bars 5 and outer surfaces of separator sheets 3, is not flat but irregular, the irregularities have to be removed by machining to provide a smooth surface so that the heat conductivity should not be reduced.

Figure 4:
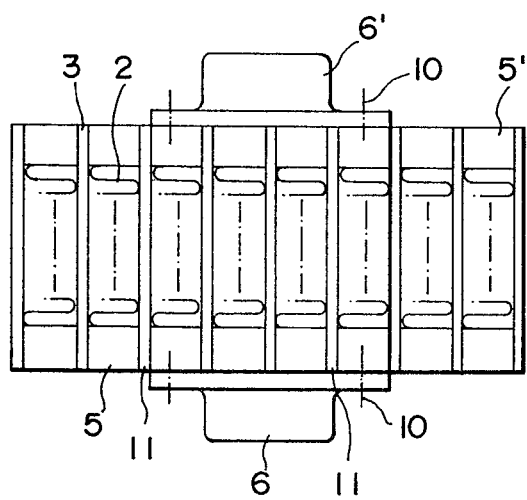
FIG. 4 an elevational view showing another embodiment of the invention.

While in the instant embodiment large thickness side bars are used only on one side of the heat sink, it is also possible to large thickness side bars 5 and 5' on both sides and mount heat sources 6 and 6' on respective side bars on both sides, as shown in FIG. 4.

As has been shown, since the heat sink according to the invention has a construction permitting direct mounting of a heat source on side bars, unlike the prior art there is no need of preparing a bottom plate as a separate member. In addition, since the side bars on which the heat source is to be mounted are perfectly brazed to separator sheets and also since the heat source engages the end of the separator sheets, satisfactory heat radiation performance can be obtained. Further, a heat sink of whatever size can be readily fabricated to meet the desired heat radiation performance by stacking required numbers of corrugated fins and separators and without need of preparing different bottom plates of various sizes, the productivity can be extremely improved.

While the present invention has been described with reference to particular embodiments thereof, it will be understood that numerous modifications may be made by those skilled in the art without actually departing from the spirit and scope of the invention as defined in the appended claims.

I claim:
1. An improved heat sink comprising:
   a plurality of corrugated fins having opposed edges;
   a plurality of separator sheets having edges at opposite sides thereof, the edges of said sheets being spaced further apart than said edges of said fins,
   said fins and said sheets being stacked in alternating relationship with said edges of all said fins and all of said sheets on opposite sides of the stack and with the edges of each of the fins disposed inwardly of the stack relative to the edges of all of the sheets;
   a plurality of side bars, each having opposed outer and inner edges, there being a respective side bar for each said edge of each fin, the inner edge of each bar being disposed in contacting relationship to the corresponding fin edge,
   the outer edges of said bars and the edges of said sheets forming a flat, smooth surface on at least one of said opposite sides of said stack, said surface having a heat source mounted thereon; and
   brazing means for interconnecting said fins, sheets and bars together for efficient heat conductivity.
2. A heat sink as set forth in claim 1 which is constructed of aluminum.
3. A heat sink as set forth in claim 1 which is constructed of copper.
4. A heat sink as set forth in claim 1 which is constructed of stainless steel.
5. A heat sink as set forth in claim 1 wherein said surface is a machined surfaced.

* * * * *